United States Patent [19]

La Bate, Jr. et al.

[11] Patent Number: 5,637,834
[45] Date of Patent: Jun. 10, 1997

[54] MULTILAYER CIRCUIT SUBSTRATE AND METHOD FOR FORMING SAME

[75] Inventors: Frank J. La Bate, Jr., Lauderhill; John A. De Santis, North Lauderdale; Anthony B. Suppelsa, Sr., Coral Springs, all of Fla.

[73] Assignee: Motorola, Inc., Schaumburg, Ill.

[21] Appl. No.: 383,128

[22] Filed: Feb. 3, 1995

[51] Int. Cl.⁶ .................................................. H06K 1/02
[52] U.S. Cl. ...................... 174/264; 174/262; 361/792; 29/846
[58] Field of Search ......................... 174/262, 264, 174/261, 260; 29/830, 846, 852; 361/792, 793, 794, 795, 784

[56] References Cited

U.S. PATENT DOCUMENTS

| | | | |
|---|---|---|---|
| 4,763,403 | 8/1988 | Klein et al. | 29/598 |
| 4,788,766 | 12/1988 | Burger et al. | 29/830 |
| 4,859,806 | 8/1989 | Smith | 174/68.5 |
| 4,908,940 | 3/1990 | Amano et al. | 29/852 |
| 4,964,212 | 10/1990 | Deroux-Dauphin et al. | 29/852 |
| 5,046,238 | 9/1991 | Daigle et al. | 29/830 |
| 5,046,239 | 9/1991 | Miller et al. | 29/852 |
| 5,261,155 | 11/1993 | Angulas et al. | 29/830 |
| 5,360,946 | 11/1994 | Feger et al. | 174/261 |
| 5,510,139 | 4/1996 | Deissner et al. | 429/97 |

OTHER PUBLICATIONS 3M 5303R Jan. 1994 Z–Axis Adhesive Film (ZAF).
Article Jun. 1992 Rigid Flex: The Old and The New Sheldahl, Inc.
Article Jun. 1992 A New Multilayer Circuit Process Based on Anisotropicity Sheldahl, Inc.
Article Sep. 1993 Ultra–Thin Multilayer Circuits Sheldahl, Inc.

*Primary Examiner*—Laura Thomas
*Attorney, Agent, or Firm*—Andrew S. Fuller

[57] ABSTRACT

A multi-layer circuit substrate (500) includes at least two substrate layers (130, 150). The first substrate layer (130) has an insulating material (100) with two opposing surfaces (101, 102), and a hole (105) extending between the two surfaces (101, 102). A conductive pattern (110) is formed on a first surface (101) of the insulating material (100) and completely covers the hole (105). The second substrate layer (150) is attached along the second surface (102) of the insulating material (100), and also includes a conductive pattern (155) on insulating material. A conductive material (140) is disposed within the hole (105) that engages the first and second conductive patterns (110, 155).

28 Claims, 3 Drawing Sheets

MULTILAYER CIRCUIT SUBSTRATE AND METHOD FOR FORMING SAME

TECHNICAL FIELD

This invention relates in general to multilayer circuit substrates and more particularly, to the electrical interconnection of layers within the substrates.

BACKGROUND

Multilayer circuits are well known in the art. Generally, a multilayer circuit substrate includes multiple stacked circuit patterns which are spaced apart by insulation material. The various layers of the circuit patterns are electrically interconnected at selected locations, typically by using conductive vias. Conductive vias are holes plated with conductive material which are formed through one or more layers of the substrate to provide electrical interconnection between layers. A particular multilayer circuit substrate may require several conductive vias to provide the necessary electrical interconnection among the various layers. The conductive via most commonly encountered in the art originates from one surface of the substrate and extends to an opposing surface of the substrate. Another type of via, the "blind via", originates at one surface and extends only through a portion of the substrate. Yet, another type, the "buried via", orginates and terminates within the substrate. A conductive via which at least originates from a surface of the substrate is termed herein as a "surface via".

Surface vias may consume significant space on a given circuit substrate. In the majority of cases, these surface vias are located away from circuit pads formed to receive electrical components, such that solder deposited on a circuit pad to facilitate the electrical interconnection of an electrical component does not flow through the via. Consequently, if an interconnection is to be made from a circuit pad located on one surface of the substrate, to a circuit pattern on another layer of the substrate, a conductive runner is formed to extend from the circuit pad to a location away from the circuit pad where the conductive via is formed. Thus, the inclusion of surface vias in a circuit substrate limits the circuit density of the substrate, and also complicates the interconnection scheme among layers. Efforts are constantly being made to limit the use of surface vias in order to achieve a more space efficient circuit substrate which has an interlayer interconnection scheme capable of supporting intricate interlayer electrical connections.

Various attempts have been made to design and manufacture multilayer substrates with interlayer electrical interconnections formed to minimize substrate space consumption. One approach is described in U.S. Pat. No. 5,046,238, issued to Daigle, et al. on Sep. 10, 1991 for A Method of Manufacturing a Multilayer Circuit Board. Daigle describes a method in which the preparation of a discrete circuit substrate layer includes the steps off forming electrical circuitry on a dielectric layer by forming an access opening at selected locations through the dielectric layer to expose selected circuit locations; forming conductive posts in the access opening to a level below the top of the access opening; and providing a fusible conductive material in the access opening on the top of the conductive posts. A stack of these substrate layers are; subjected to heat and pressure simultaneously to fuse the layers of dielectric substrate and the fusible conductive material, to provide a multilayer circuit board. This prior art method has several disadvantages including problems encountered with spreading of the solder during lamination, and problems caused by the presence of flux material necessary to deoxidize the solder which creates long term reliability problems. Multilayer structures made with fusible dielectric materials tend to be too fragile, too expensive, and not suitable for high thermal applications.

Another method is described in U.S. Pat. No. 5,309,629, issued to Traskos, et al. on May 10, 1994, for a Method of Manuafacturing a Multilayer Circuit Board. Traskos' method is similar to that of Daigle except that multiple substrate layers are laminated rather than fused together. This method still produces circuit substrates which suffer from some of the problems of Daigle, including cost, complexity, and lack of suitability for many applications.

It is desirable to have a multilayer circuit substrate in which through-hole conductive vias do not consume valuable space on the surface of the circuit substrate. Additionally, it is desirable to accommodate a significant number of interconnections among the various layers of the circuit substrate. Yet, such a circuit substrate must be capable of being economically manufactured and must provide reliable electrical interconnections among the layers, while supporting a variety of applications. Therefore, a new approach to the manufacturing of multilayer circuit substrates is needed.

DETAILED DESCRIPTION OF THE PREFERRED EMBODIMENT

Figure 1:
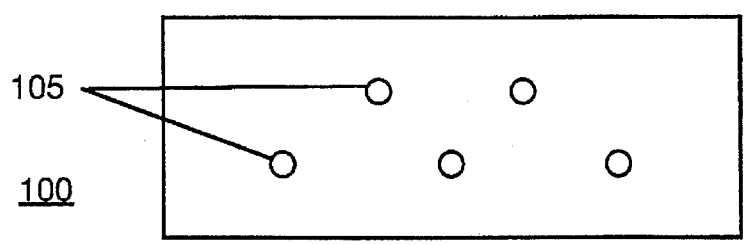
FIG. 1 is a top view of a polymeric insulating material having prepunched holes, in accordance with the present invention.
Figure 2:
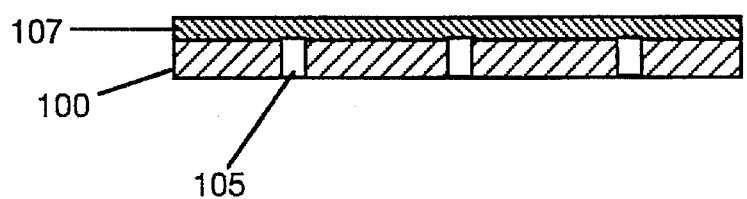
FIG. 2 is a cross-sectional view of the insulating material of FIG. 1 having a copper foil sheet laminated thereto, in accordance with the present invention.

While the specification concludes with claims defining the features of the invention that are regarded as novel, it is believed that the invention will be better understood from a consideration of the following description in conjunction with the drawing figures, in which like reference numerals are carried forward.

Generally, the present invention provides for a multilayer circuit substrate in which electrical interconnection among the various layers is achieved without the use of plated-through holes extending from a surface of the multilayer substrate. According to the present invention, a circuit substrate layer is formed by disposing a circuit pattern on a layer of dielectric material, and by exposing the underside of a portion of the circuit pattern, such as a circuit pad, through an opening formed in the dielectric layer that is aligned with the circuit pattern. The opening does not extend through the circuit pattern. Multiple substrate layers are combined by disposing a conductor, such as a conductive adhesive, between the layers and within openings exposing portions of one or more circuit patterns where electrical interconnection is desired. Preferably, an anisotropic conductor is used, such as a Z-axis conductive adhesive. In a preferred embodiment, holes are preformed in the dielectric layer and the circuit pattern formed onto the dielectric layer over the preformed holes.

FIGS. 1–6 show a multilayer circuit board in various stages of construction, in accordance with the present invention. Preferably, a substrate layer is formed from a layer of polymeric dielectric material upon which conductive patterns are formed. Multiple substrate layers are then combined to form the multilayer circuit substrate. Referring to FIG. 1, a layer of dielectric insulating material 100 having preformed holes or openings 105 is shown, in accordance with the present invention. The dielectric layer 100 is formed from a thin sheet of polymeric material 100, such as polyimide, fluoropolymer, or polyester, and the holes 105 are located where interlayer circuit electrical connection is needed. The holes 105 are punched, drilled, or otherwise formed using well known techniques. Next, in FIG. 2, a copper foil sheet 107 or other suitable conductive material is laminated to the polymeric insulating layer 100 having the preformed holes. Note that any suitable conductive material may be applied using a variety of methods such as electroless plating, electroplating, vapor deposition, and the like.

Figure 3:
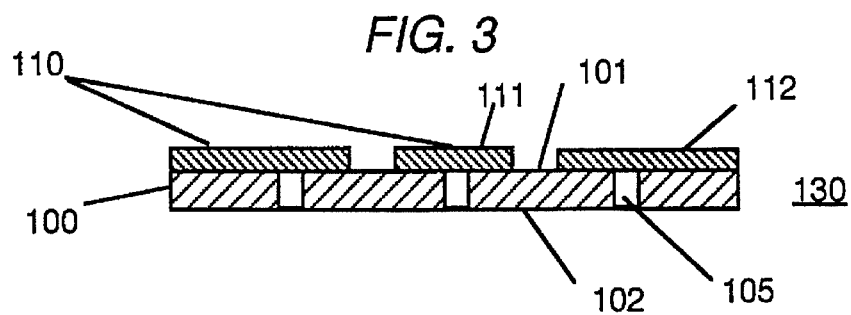
FIG. 3 is a cross-sectional view of a substrate layer having a circuit pattern defined on a dielectric layer, in accordance with the present invention.
Figure 4:
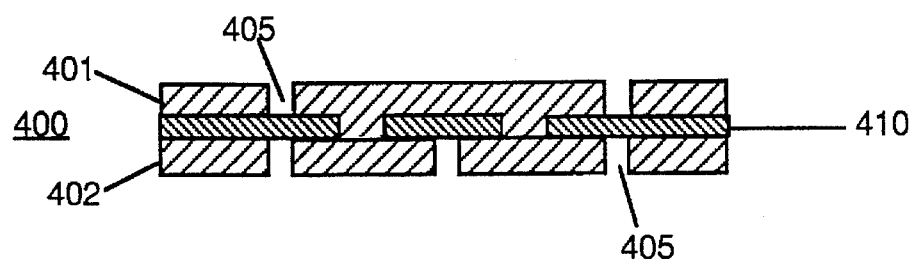
FIG. 4 is a cross-sectional view of an alternative embodiment of a substrate layer, in accordance with the present invention.

Referring to FIG. 3, a pattern 110 of circuit traces and pads is formed onto a first surface 101 of the dielectric layer 100 using known techniques. In the preferred embodiment, the circuit; traces 112 and circuit pads 111 are formed by a photo-definition and etching process which removes portions of the laminated copper 107 (see FIG. 2) on the first surface 101 of the dielectric layer 100 to form a conductive pattern 110. A substrate layer 130 is formed which includes the insulating dielectric layer material, and the conductive pattern 110, including circuit or connector pads 111 which form the basis for interlayer electrical interconnections. Alternatively, the conductive pattern may be first disposed on one surface of an insulating layer without; preformed holes, and insulating material removed from the insulating layer, such as by laser and the like, on an opposing surface to expose the underside of the conductive pattern thereby forming the substrate layer. FIG. 4 shows an alternative embodiment, in which a substrate layer 400 is formed with a circuit pattern 410 insulated between layers 401,402 of dielectric material. Electrical interconnection with the circuit pattern 410 is provided through access holes 405 formed in the insulating material which expose, but do not penetrate, portions of the circuit pattern 410.

Figure 5:
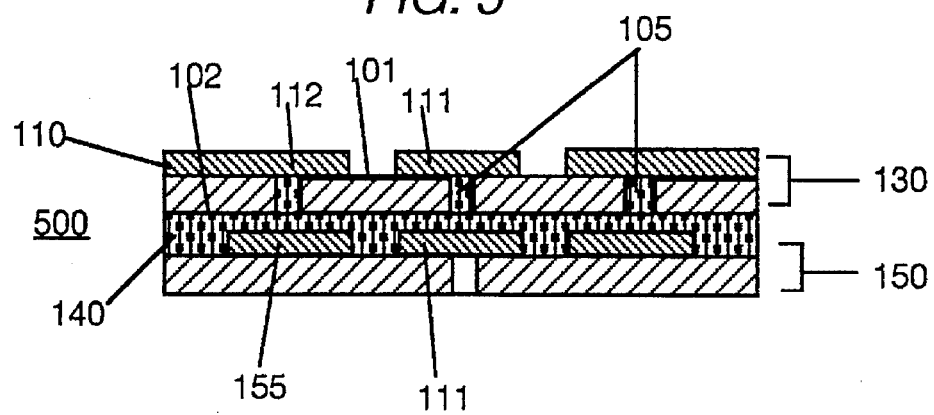
FIG. 5 is a two-layer circuit substrate formed in accordance with the present invention.

Once the various layers of the circuit substrates are constructed, the layers are then combined by disposing a conductive material within the holes to engage conductive patterns of adjacent layers. FIG. 5 shows a two-layer circuit substrate 500 so constructed in which first and second conductive patterns 110, 155 are electrically interconnected. In the preferred embodiment, an anisotropic conductive adhesive material 140 is interposed between two substrate layers 130, 150, such that some of the conductive adhesive 140 engage interconnect pads 111 through the holes 105 at each layer to provide interlayer electrical interconnection.

Preferably, the conductive adhesive used is an anisotropic bonding material which is electrically conductive in a specific direction. This type of conductive adhesive is commonly referred to as a Z-axis adhesive, and is available under the tradename Z-LINK® from the Sheldahl Corporation, and Z-axis Adhesive Film available from the 3M company. The individual substrate layers 130, 150 are then co-laminated by mating the layers together in a heated environment such that the conductive adhesive 140 is thermally set. The result is an easily manufactured multilayer circuit substrate 500 which offers intricate interlayer interconnections. The two-layer circuit substrate 500 may be further combined with other substrate layers to form a denser circuit substrate package.

Figure 6:
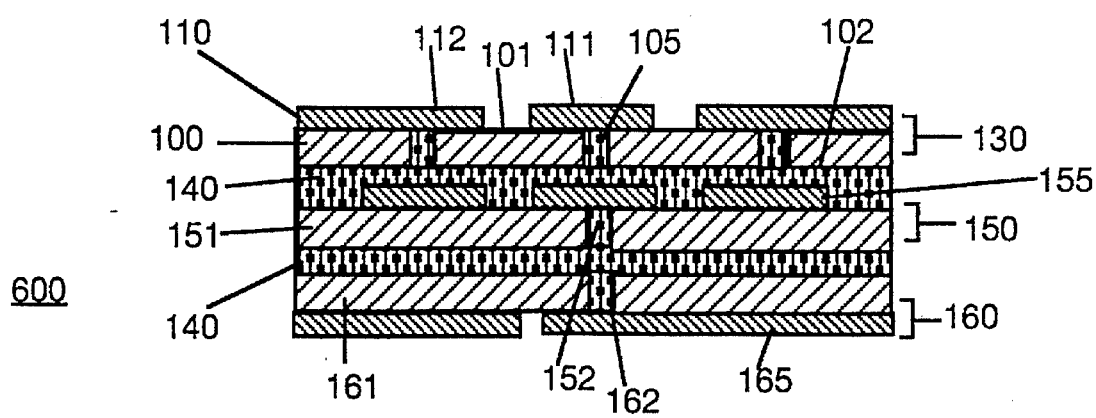
FIG. 6 is a multi-layer circuit substrate in accordance with the present invention.

FIG. 6 shows a cross-sectional view of a circuit substrate 600 which has been formed in accordance with the present invention. The multilayer circuit substrate 600 has a first substrate layer 130 including an insulating material 100 having opposing surfaces, an access hole 105 extending from one surface 101 to an opposing surface 102 and a conductive pattern 110 formed on one surface that covers the access hole 105. The hole exposes a portion of the circuit pattern 110, such as a circuit pad 111, from the opposing surface of the insulating dielectric layer 100 upon which the circuit pattern 110 is disposed. A second substrate layer 150 has a conductive or circuit pattern 155 disposed on insulating material 151. The second substrate layer 150 has a hole 152 in the insulating material 151 that exposes a portion of the circuit pattern 155 through the insulating material 151. A third substrate layer 160 has a circuit pattern 165 disposed on a layer of insulating dielectric material 161 that has a hole 162 which exposes a portion of the circuit pattern through an opposing surface. The substrate layers are combined such that access holes 105, 152, 162 each align a portion of one conductive pattern to a portion of another conductive pattern. Some access holes, such as the access holes 152, 162 in the second and third substrate layers 150, 160 may be themselves aligned. An anisotropic conductive adhesive 140 disposed between the substrate layers 130, 150, 160 and in the passages 105, 152, 162 electrically couples portions of the first circuit pattern 110 to uninsulated portions of the second circuit pattern 155, and also electrically couples uninsulated portions of the third conductive or circuit pattern 165 to uninsulated portions of the second circuit pattern 155.

Figure 7:
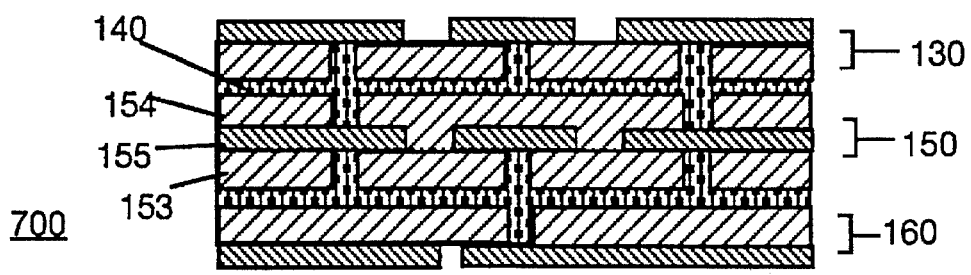
FIG. 7 is an alternative embodiment of the multi-layer circuit substrate of FIG. 6.

FIG. 7 shows an alternative substrate 700 in which the circuit pattern 155 of the second substrate layer 150 is disposed between, and directly interfaces with adjacent insulating layers 153, 154. Otherwise, the multi-layer circuit substrate 700 is constructed as described with respect to FIG. 6.

Figure 8:
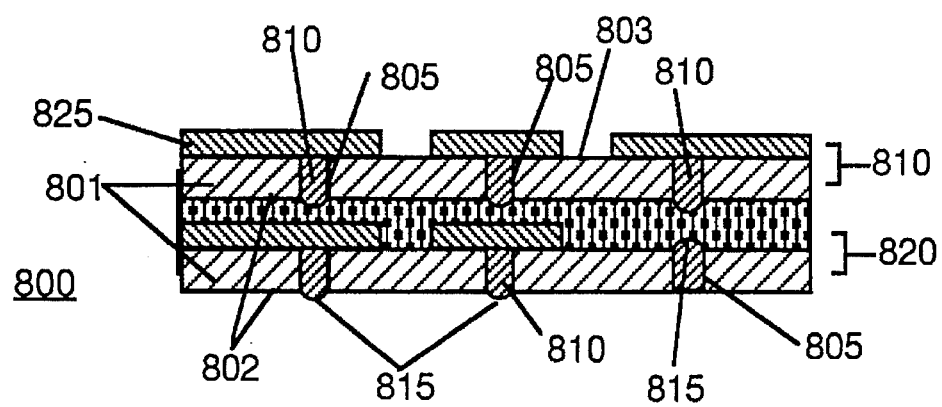
FIG. 8 is an embodiment of a multi-layer circuit substrate having access holes plated with conductive material, in accordance with the present invention.

FIG. 8 shows an alternative embodiment of a multi-layer circuit substrate in which various access holes 805 for interconnection purposes within the substrate layers are plated with a conductive material 810. The same conductive material 810 engages a conductive pattern 825 on one surface 803 of a corresponding dielectric layer 801, and extends through an access hole 805 to form a bump or protruding portion 815 projecting from an opposing surface 802 of the dielectric layer 801. Preferably, the conductive material 810 is copper or other suitable non-fusible conductive material, i.e., a material that will substantially retain its shape during the process used to combine the various substrate layers, including the thermal setting of the anisotropic material. The bump 815 protrudes from the surface 802 of the insulating layer and facilitates interconnection between the substrate layers 830, 820 to ensure proper electrical coupling between substrate layers 830, 820.

Figure 9:
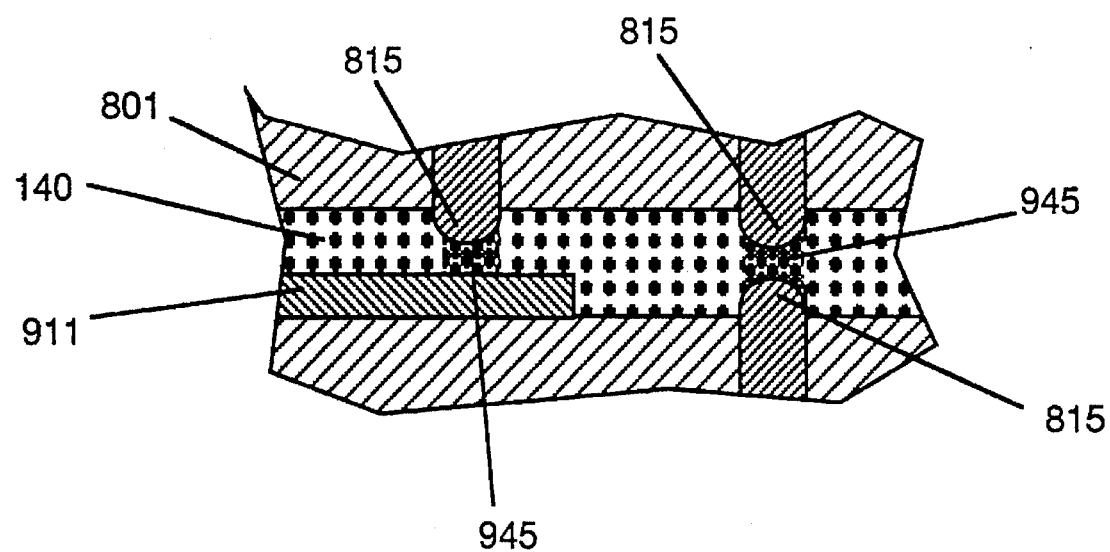
FIG. 9 is a fragmentary cross-sectional view of the substrate of FIG. 8 highlighting the function of a conductor bump, in accordance with the present invention.

FIG. 9 illustrates how the bump 815 functions to improve interconnection reliability using the anisotropic conductive material 140. As shown, the anisotropic material 140 has small conductor particles or spheres 945 disposed in an adhesive base. The bump 815 facilitates compression of the conductor particles 945 to form a more reliable electrical interconnect between substrate layers through the bump 815 and an interconnect conductor pad 911 or another bump 815. Additionally, the compressed conductor particles 945 are more easily fused onto the conductor bump 815. One skilled in the art would expect a substrate with the plated conductor bumps to be more expensive to manufacture than one without because of the need for a plating process. However, the plated conductor bumps may increase interconnect reliability.

The present invention offers significant advantages over the prior art. For example, a manufacturing process of forming substrate layers from circuit patterns defined on polymeric layers with preformed holes, and combining the layers using a conductive adhesive can be inexpensive relative to prior art multi-layer circuit substrate construction methods. The cost, complexity, and unreliability associated with prior art approaches utilizing solder for interlayer interconnection are avoided. The present invention provides for an efficient and cost effective multi-layer circuit substrate suitable for many applications.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of forming a multi-layer circuit substrate, comprising the steps of:
   forming a first substrate layer, including the steps of:
      disposing a first conductive pattern on a first surface of an insulating layer;
      exposing the first conductive pattern from a second surface of the insulating layer opposing the first surface, through an opening that extends through the insulating layer to the first surface, but not through the first conductive pattern;
   forming a second substrate layer including a second conductive pattern;
   interposing a conductive adhesive between the first substrate layer and the second substrate layer that electrically interconnects the first conductive pattern to the second conductive pattern; and
   combining the first substrate layer and the second substrate layer to form the multi-layer circuit substrate.

2. The method of claim 1, wherein the step of exposing the first conductive pattern, comprises the steps of:
   forming the opening in the insulating layer; and
   disposing the first conductive pattern on the insulating layer such that a portion of the first conductive pattern completely covers the opening.

3. The method of claim 1, wherein the step of exposing the first conductive pattern, comprises the step of removing a portion of insulating material from the second surface of the insulating layer to expose an underside of the first conductive pattern.

4. The method of claim 1, wherein the step of interposing a conductive adhesive, comprises the step of interposing an anisotropic conductive adhesive.

5. A method of forming a multi-layer circuit substrate, comprising the steps of:
   forming a first substrate layer, including the steps of:
      forming a first hole in a first insulating layer;
      disposing a first conductive pattern on the first insulating layer to cover the first hole;
   forming a second substrate layer, including the steps of:
      forming a second hole in a second insulating layer;
      disposing a second conductive pattern on the second insulating layer to cover the second hole;
   combining the first substrate layer and the second substrate layer such that the first hole is aligned with a portion of the second conductive pattern; and
   disposing an anisotropic conductive material within the first hole that engages the first conductive pattern and that interconnects the first conductive pattern to the second conductive pattern through the first hole.

6. The method of claim 5, wherein the step of disposing an anisotropic conductive material comprises the step of disposing a conductive adhesive.

7. The method of claim 5, wherein the step of combining comprises the step of substantially aligning the first and second holes.

8. The method of claim 5, wherein the step of forming the second substrate layer comprises the step of disposing the second conductive pattern between layers of insulating material.

9. The method of claim 5, wherein the step of combining comprises the steps of laminating the first and second substrate layers to thermally set the anisotropic conductive material.

10. The method of claim 5, further comprising the steps of:
    forming a third substrate layer, including the steps of:
       providing a third insulating layer having a third hole extending therethrough;
       disposing a third conductive pattern on the third insulating layer that covers the third hole;
    interconnecting the second and third conductive patterns through a passage formed in part by the second hole; and
    combining the first, second, and third substrate layers to form the multi-layer circuit substrate.

11. A method of forming a multi-layer circuit substrate, comprising the steps of:
    forming a first substrate layer, including the steps of:
       disposing a first conductive pattern on insulating material;
       exposing a portion of the first conductive pattern through a hole formed in the insulating layer that does not penetrate the first conductive pattern;
    forming a second substrate layer by disposing a second conductive pattern on insulating material;
    combining the first substrate layer and the second substrate layer such that a passage, comprising the hole, extends between the first conductive pattern and the second conductive pattern; and
    disposing an anistropic conductive material within the passage, to electrically interconnect the first conductive pattern with the second conductive pattern.

12. The method of claim 11, wherein the step of disposing an anistropic conductive material comprises the step of disposing a Z-axis conductive adhesive between the first and second substrate layers.

13. The method of claim 11, wherein the step of forming the first substrate layer, comprises the step of forming a circuit pad that covers the hole of the first substrate layer.

14. The method of claim 11, wherein the step of disposing a first conductive pattern, comprises the step of forming a connector pad for interconnecting substrate layers.

15. The method of claim 11, wherein the step of combining, comprises the step of co-laminating the first and second substrate layers.

16. A method of forming a multi-layer circuit substrate, comprising the steps of:

forming a first substrate layer, including the steps of:
disposing a first conductive pattern on a first surface of an insulating layer;
exposing the first conductive pattern from a second surface of the insulating layer opposing the first surface, through an opening that extends through the insulating layer to the first surface, but not through the first conductive pattern;
disposing a first conductive material within the opening to engage the first conductive pattern and to form a conductor bump protruding from the second surface, of the insulating layer;

forming a second substrate layer including a second conductive pattern;

interposing a second conductive material between the first substrate layer and the second substrate layer; and combining the first substrate layer and the second substrate layer such that the conductor bump compresses the second conductive material and electrically interconnects the first conductive pattern to the second conductive pattern.

17. The method of claim 16, wherein the step of interposing a second conductive material comprises the step of interposing an anisotropic conductive material.

18. The method of claim 16, wherein the step of disposing a first conductive material comprises the step of plating a non-fusible conductive material within the opening to form the conductor bump.

19. A multi-layer circuit substrate, comprising:

a first substrate layer, comprising:
a first insulating material having a first surface and a second surface opposing the first surface, and having a hole extending from the first surface to the second surface;
a first conductive pattern formed on the first surface and completely covering the hole;

a second substrate layer attached along the second surface of the first substrate layer, the second substrate layer comprising a second insulating material having a second conductive pattern;

a first conductive material disposed within the hole and engaging the first conductive pattern and protruding from the second surface to form a conductor bump; and a second conductive material disposed between the first substrate layer and the second substrate layer;

wherein the first substrate layer is combined with the second substrate layer such that the conductor bump compresses the second conductive material and electrically interconnects the first and second substrate layers.

20. The multi-layer circuit substrate of claim 19, wherein the second conductive material is a conductive adhesive.

21. The multi-layer circuit substrate of claim 19, wherein the second conductive material is an anistropic material.

22. A multi-layer circuit substrate, comprising:

a first substrate layer, comprising:
a first insulating material having first and second opposing surfaces, and having a hole extending from the first surface to the second surface;
a first conductive pattern formed on the first surface and completely covering the hole;

a second substrate layer attached along the second surface of the first substrate layer, the second substrate layer comprising a second insulating material having a second conductive pattern; and a conductive material disposed within the hole and engaging the first and second conductive patterns.

23. The multi-layer circuit substrate of claim 22, wherein the conductive material is a conductive adhesive.

24. The multi-layer circuit substrate of claim 22, wherein the conductive material is an anistropic material.

25. The multi-layer circuit substrate of claim 22, wherein the first and second substrate layers are co-laminated and the conductive material is thermally set.

26. The multi-layer circuit substrate of claim 22, wherein the second conductive pattern is disposed between, and directly interfaces with, first and second insulating layers, the second conductive pattern has a first uninsulated portion exposed through the first insulating layer and a second uninsulated portion exposed through the second insulating layer.

27. The multi-layer circuit substrate of claim 19, wherein the first insulating material has a plurality of holes and the first conductive pattern covers the plurality of holes, and the first conductive material is disposed within the plurality of holes to form conductor bumps which compress the second conductive material to provide interlayer interconnection.

28. The multi-layer circuit substrate of claim 22, wherein the first insulating material has a plurality of holes and the first conductive pattern covers the plurality of holes, and the conductive material is disposed within the plurality of holes and engages the first and second conductive patterns to provide interlayer interconnection.

* * * * *